United States Patent
Daghighian et al.

(10) Patent No.: US 9,526,185 B2
(45) Date of Patent: Dec. 20, 2016

(54) HYBRID PCB WITH MULTI-UNREINFORCED LAMINATE

(71) Applicant: FINISAR CORPORATION, Sunnyvale, CA (US)

(72) Inventors: Henry Meyer Daghighian, Menlo Park, CA (US); Steven C. Bird, San Jose, CA (US); Gerald Douglas Babel, Danville, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 290 days.

(21) Appl. No.: 14/248,108

(22) Filed: Apr. 8, 2014

(65) Prior Publication Data

US 2015/0289368 A1  Oct. 8, 2015

(51) Int. Cl.
H05K 3/46 (2006.01)
H05K 3/24 (2006.01)
H05K 1/02 (2006.01)
H05K 1/03 (2006.01)

(52) U.S. Cl.
CPC ............ *H05K 3/4688* (2013.01); *H05K 3/244* (2013.01); *H05K 1/024* (2013.01); *H05K 1/0366* (2013.01); *H05K 2201/0141* (2013.01); *H05K 2201/0154* (2013.01); *H05K 2201/0191* (2013.01)

(58) Field of Classification Search
None
See application file for complete search history.

(56) References Cited

U.S. PATENT DOCUMENTS

| | | | | |
|---|---|---|---|---|
| 3,902,951 A * | 9/1975 | Doi | ................ | C08F 283/10 156/307.5 |
| 4,314,002 A * | 2/1982 | Oizumi | ................ | B32B 27/10 174/255 |
| 4,395,459 A * | 7/1983 | Herschdorfer | ...... | B29C 47/0004 156/243 |
| 4,661,568 A * | 4/1987 | Koenig | ................ | C08G 14/10 525/510 |
| 4,943,334 A * | 7/1990 | Medney | ................ | B29C 53/564 156/169 |
| 5,357,040 A * | 10/1994 | McGrath | ............ | C08G 65/4093 528/480 |
| 5,785,787 A * | 7/1998 | Wojnarowski | ......... | H05K 1/024 156/155 |
| 5,785,789 A * | 7/1998 | Gagnon | ................ | B32B 27/04 156/230 |
| 7,186,919 B2 * | 3/2007 | Kim | ................ | H05K 1/162 174/250 |

(Continued)

*Primary Examiner* — Jeremy C Norris
*Assistant Examiner* — Muhammad Azam
(74) *Attorney, Agent, or Firm* — Maschoff Brennan (57) ABSTRACT

A hybrid printed circuit board may include a top layer, a bottom layer, and a plurality of internal layers stacked up between the top layer and the bottom layer. The plurality of internal layers may include a first internal layer below the top layer and a second internal layer above the bottom layer. The hybrid printed circuit board may include first unreinforced laminate placed between the top layer and the first internal layer. The hybrid circuit board may additionally include second unreinforced laminate placed between the second internal layer and the bottom layer. The hybrid printed circuit board may include third laminate placed between adjacent internal layers of the plurality of internal layers.

20 Claims, 8 Drawing Sheets

(56) References Cited

U.S. PATENT DOCUMENTS

| | | | | |
|---|---|---|---|---|
| 2001/0022718 A1* | 9/2001 | Appelt | H05K 1/162 | 361/502 |
| 2001/0050603 A1* | 12/2001 | Bergstedt | H01P 3/081 | 333/238 |
| 2002/0038582 A1* | 4/2002 | Holl | B22F 3/20 | 75/230 |
| 2002/0113178 A1* | 8/2002 | Ligertwood | F16M 11/10 | 248/158 |
| 2002/0132104 A1* | 9/2002 | Urakami | B32B 5/32 | 428/308.4 |
| 2002/0148639 A1* | 10/2002 | Smith | H01L 23/49811 | 174/255 |
| 2002/0153164 A1* | 10/2002 | Cheng | H05K 1/024 | 174/255 |
| 2002/0153613 A1* | 10/2002 | Cheng | H05K 1/024 | 257/760 |
| 2002/0168475 A1* | 11/2002 | Yamaji | C08J 3/245 | 427/386 |
| 2003/0029830 A1* | 2/2003 | Takaya | H01F 17/0006 | 216/13 |
| 2003/0162006 A1* | 8/2003 | Ikeguchi | B32B 27/08 | 428/220 |
| 2003/0194485 A1* | 10/2003 | Rhee | H05K 3/244 | 430/315 |
| 2004/0256731 A1* | 12/2004 | Mao | C08L 65/00 | 257/773 |
| 2005/0040513 A1* | 2/2005 | Salmon | H01L 21/486 | 257/698 |
| 2005/0093133 A1* | 5/2005 | Kawasaki | H01L 23/49822 | 257/700 |
| 2005/0121226 A1* | 6/2005 | McKee | H05K 1/036 | 174/259 |
| 2006/0012452 A1* | 1/2006 | Kwong | H01P 3/06 | 333/238 |
| 2006/0159928 A1* | 7/2006 | Motobe | C08G 59/063 | 428/413 |
| 2006/0257622 A1* | 11/2006 | Shin | B32B 5/022 | 428/137 |
| 2007/0006435 A1* | 1/2007 | Banerji | H01L 21/4857 | 29/25.41 |
| 2007/0124931 A1* | 6/2007 | Honer | H05K 3/4623 | 29/852 |
| 2007/0148971 A1* | 6/2007 | Saha | H01L 23/49811 | 438/686 |
| 2007/0269935 A1* | 11/2007 | Pethe | H05K 3/041 | 438/129 |
| 2007/0281566 A1* | 12/2007 | Ohta | B32B 15/08 | 442/180 |
| 2009/0151984 A1* | 6/2009 | Fujimura | C08J 5/24 | 174/250 |
| 2009/0229868 A1* | 9/2009 | Tsukada | H05K 3/4661 | 174/258 |
| 2009/0255714 A1* | 10/2009 | Sohn | C08J 5/046 | 174/250 |
| 2010/0051327 A1* | 3/2010 | Ogatsu | H05K 1/0366 | 174/254 |
| 2010/0227170 A1* | 9/2010 | Endo | C08L 63/00 | 428/413 |
| 2011/0127233 A1* | 6/2011 | Chen | H05K 3/244 | 216/13 |
| 2011/0232953 A1* | 9/2011 | Oga | H05K 3/4602 | 174/258 |
| 2012/0211268 A1* | 8/2012 | Halahmi | H05K 1/0306 | 174/260 |
| 2013/0057451 A1* | 3/2013 | Petty-Weeks | H01L 23/66 | 343/905 |
| 2014/0204546 A1* | 7/2014 | Baker | H05K 3/4688 | 361/760 |
| 2014/0220844 A1* | 8/2014 | Amla | H01B 3/40 | 442/180 |
| 2015/0013644 A1* | 1/2015 | Friedrich | F02M 55/004 | 123/470 |

* cited by examiner

HYBRID PCB WITH MULTI-UNREINFORCED LAMINATE

FIELD

Some embodiments described herein generally relate to constructing printed circuit boards.

BACKGROUND

Unless otherwise indicated herein, the materials described herein are not prior art to the claims in the present application and are not admitted to be prior art by inclusion in this section.

Existing printed circuit boards (PCBs) constructed using glass-reinforced laminate may not be suitable for high speed applications. For example, when a PCB with glass-reinforced laminate operates at a high frequency, significant parasitic capacitance and/or inductance may be incurred by transmission lines in the PCB, which can distort transmitted signals. Existing technologies attempt to improve the high speed performance of the PCB by reshaping the glass weave in the laminate.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to techniques for constructing printed circuit boards.

In an example embodiment, a hybrid printed circuit board is described. The hybrid printed circuit board may include a top layer, a bottom layer, and a plurality of internal layers stacked up between the top layer and the bottom layer. The plurality of internal layers may include a first internal layer below the top layer and a second internal layer above the bottom layer. The hybrid printed circuit board may include first unreinforced laminate placed between the top layer and the first internal layer. The hybrid circuit board may additionally include second unreinforced laminate placed between the second internal layer and the bottom layer. The hybrid printed circuit board may include third laminate placed between adjacent internal layers of the plurality of internal layers.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Embodiments described herein generally relate to printed circuit boards and techniques for constructing printed circuit boards.

Example embodiments include hybrid printed circuit boards (PCBs). A hybrid PCB may include a set of substrates that enables efficient transmission at a speed equal to or greater than 25 gigabits per second per channel for chip-on-flex (COF) and chip-on-board (COB) optics products. The efficient transmission may be achieved by a unique combination of wire bondable interconnects, super fine ball grid arrays (BGAs), super fine traces with a width of 50 micrometers (μms) and space of 60 micrometers, 70-micrometer wire bond pads, and/or on-board integrated circuits (e.g., drivers, clock data recoveries (CDRs), flip-chip solder bump, overloads, power circuits, and other circuits). In addition to the efficient transmission with a speed equal to or greater than 25 gigabits per second per channel, the hybrid PCB described herein may also be used in customer hot-pluggable applications. In other embodiments, one or more of the particular values and/or dimensions of the transmission speed, trace width, trace spacing, and wire bond pad size may be the same or different than the foregoing values and/or dimensions.

In some embodiments, the hybrid PCB described herein may include multiple layers including a top layer, a bottom layer, and multiple internal layers between the top layer and the bottom layer. Different layers of the hybrid PCB may be stacked up in a top-to-bottom order of: the top layer; a first internal layer; one or more additional internal layers if there are any; a second internal layer; and the bottom layer. Copper clad high-frequency unreinforced laminate (e.g., glass-free polyimide, liquid crystal polymer (LCP), Zeta-Lam, or other glass-free unreinforced laminate) may be placed between the top layer and the first internal layer and also between the bottom layer and the second internal layer. Reinforced laminate (e.g., Megtron VI, flame retardant four (FR-4), or other glass-weave reinforced laminate) may be placed between each two adjacent internal layers.

The high-frequency unreinforced laminate used herein may include a thin sheet of glass-free dielectric material with a thickness of about 37 or 38 micrometers, with low relative permittivity (low Dk) and low loss tangent (low Df) compared to the reinforced laminate.

By utilizing high-frequency unreinforced laminate on the top and bottom of the hybrid PCB, connecting elements with super fine geometries may be constructed on the top side and the bottom side of the hybrid PCB. For example, traces with a trace width between 50 micrometers and 60 micrometers, trace pitches with a pitch width between 100 and 110 micrometers, wire bond pads in a 60-micrometer scale, and BGA pitches smaller than 0.4 millimeter may be constructed on the top side and the bottom side of the hybrid PCB, respectively. As a result, high-density interconnects may be routed on the top side and the bottom side of the hybrid PCB, while low-speed components and power circuits may be routed and/or located in the internal layers of the hybrid PCB.

Surface finishing of the hybrid PCB may be performed using electroless nickel electroless palladium immersion gold (ENEPIG) or other suitable surface finishing. A surface finish created using an ENEPIG process may be referred to as an ENEPIG surface finish. ENEPIG surface finishes may include an electroless nickel plating covered by an electroless palladium plating covered by a thin layer of immersion gold. The surface finish including palladium (Pd) may enable the hybrid PCB to pass corrosion tests such as a mixed flowing gas test. The palladium may be sufficiently thick so that the hybrid PCB may pass the mixed flowing gas test. For example, a thickness of the palladium used herein may be about 0.5 micrometers or more, rather than a regular thickness between 0.03 micrometers and 0.3 micrometers. As used herein, the term "about" as applied to a value may indicate a range of ±10% of the stated value. The usage of the palladium may eliminate plating tie bars in the hybrid PCB and may also improve contact durability of the hybrid PCB. As a result, hot pluggable edge connectors with high flexural strength and scratch tolerance may be constructed for the hybrid PCB.

The usage of high-frequency unreinforced laminate on the top and bottom sections of the hybrid PCB and the usage of palladium in the surface finish may allow connecting elements with super fine geometries to be deposited on the top side and the bottom side of the hybrid PCB. The super fine connecting elements (e.g., super fine traces with a width of about 50 micrometers) may enable the hybrid PCB to operate at a speed equal to or greater than about 25 gigabits per second per channel in the COF or COB optics products.

The configuration of the hybrid PCBs described herein may support a uniform strategy for both COB and COF products. The hybrid PCBs may have identical features such as identical transmission line widths (e.g., trace widths), line-to-line gaps, pad sizes, die pads, and bond diagrams for both COB and COF products. Also, for both COB and COF products, identical unreinforced glass-free laminate may be used in the hybrid PCBs as described herein. The stiffeners of hybrid PCBs for COB products and COF products may be different. For example, in a hybrid PCB for a COB product, internal layers and reinforced laminate between adjacent internal layers (e.g., FR-4 or Megtron VI) may serve as a stiffener for the hybrid PCB; however, a hybrid PCB for a COF product may include a nickel plated copper slug with a thickness of about 1.5 millimeters as a stiffener of the hybrid PCB.

Reference will now be made to the drawings to describe various aspects of some example embodiments of the invention. The drawings are diagrammatic and schematic representations of such example embodiments, and are not limiting of the present invention, nor are they necessarily drawn to scale.

Figure 1:
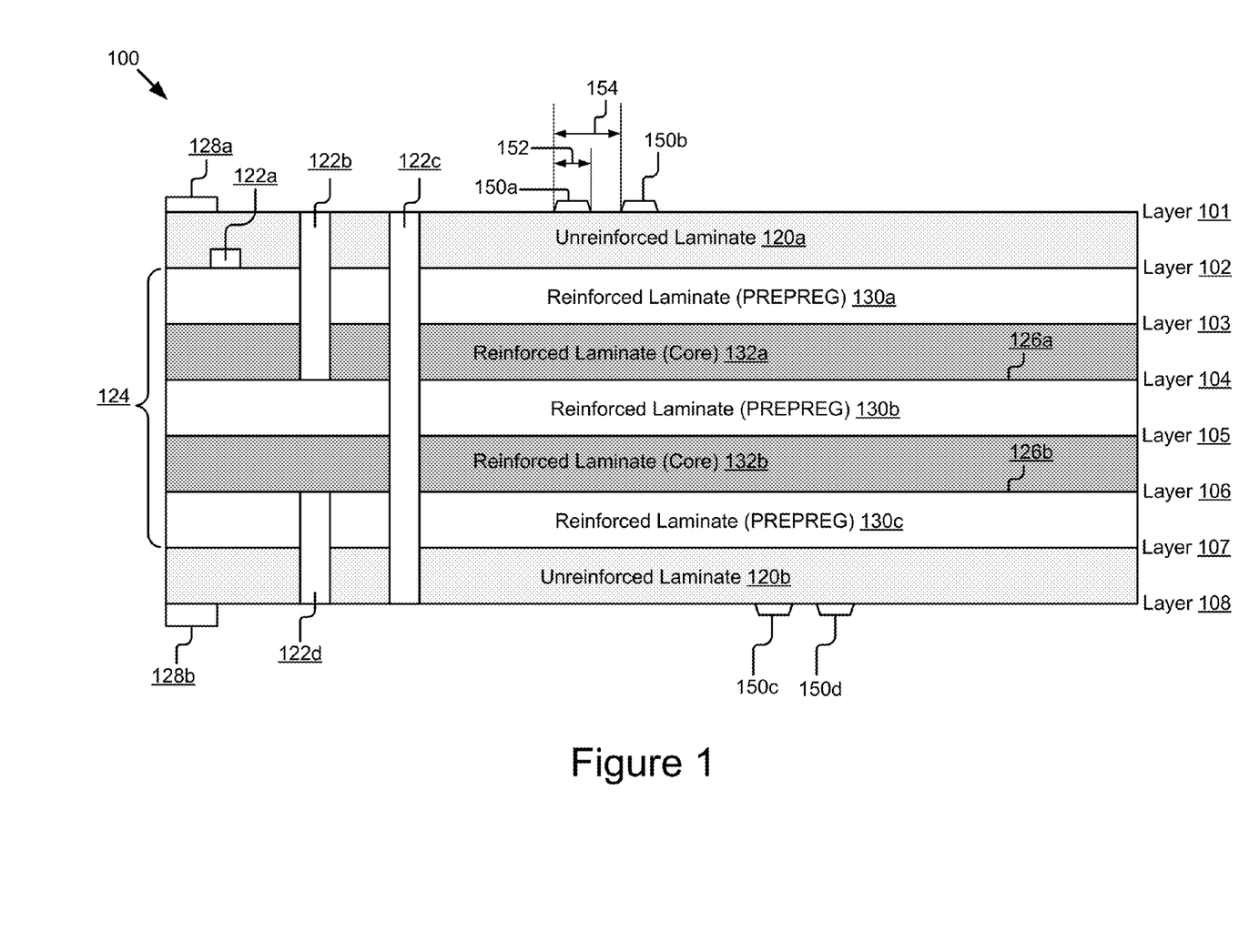
FIG. 1 is a block diagram illustrating a cross-sectional view of a stack-up of an example hybrid printed circuit board.

FIG. 1 is a block diagram illustrating a cross-sectional view of a stack-up of an example hybrid PCB 100, arranged in accordance with at least some embodiments described herein. The hybrid PCB 100 may include multiple copper-foil layers. For example, as illustrated in FIG. 1, the hybrid PCB 100 may include eight layers 101-108. The layer 101 may be referred to as a top layer, the layer 108 may be referred to as a bottom layer, and the layers 102-107 may be referred to as internal layers stacked up between the top layer 101 and the bottom layer 108.

Reinforced laminate 130a may be placed between the internal layer 102 and the internal layer 103. Reinforced laminate 130b may be placed between the internal layer 104 and the internal layer 105. Reinforced laminate 130c may be placed between the internal layer 106 and the internal layer 107. The reinforced laminates 130a, 130b, and 130c may include glass-reinforced epoxy laminate. For example, each of the reinforced laminates 130a, 130b, and 130c may include pre-impregnated (PREPREG) composite fibers having a fiber weave impregnated with bonding resins such as epoxy. In some embodiments, the reinforced laminates 130a, 130b, and 130c may include ISOLA FR370HR with approval for IPC-4101C/26/126. The reinforced laminates 130a, 130b, and 130c may alternately or additionally include other suitable reinforced laminates.

Reinforced laminate 132a may be placed between the internal layer 103 and the internal layer 104. Reinforced laminate 132b may be placed between the internal layer 105 and the internal layer 106. The reinforced laminates 132a and 132b may include glass-reinforced epoxy laminate. For example, each of the reinforced laminates 132a and 132b may include a core formed by Megtron VI or FR-4. In some embodiments, the reinforced laminates 132a and 132b may include ISOLA FR370HR with approval for IPC-4101C/26/126 or other suitable reinforced laminates.

Unreinforced laminate 120a may be placed between the top layer 101 and the internal layer 102. Unreinforced laminate 120b may be placed between the internal layer 107 and the bottom layer 108. The unreinforced laminates 120a and 120b may include high-frequency glass-free (or fiber-weave-free) laminate or flex. In other words, the unreinforced laminates 120a and 120b may not include glass or glass weaves. For example, the unreinforced laminates 120a and 120b may include glass-free dielectric material such as glass-free polyimide (e.g., DuPont® polyimide series including AP, AC, AK series, and Pyralux TK series), liquid crystal polymer, ZetaLam, and/or another suitable type of glass-free dielectric material. Each of the unreinforced laminates 120a and 120b may include a thin laminate sheet with a thickness of approximately 37 or 38 micrometers and with lower relative permittivity (lower Dk) and lower loss tangent (lower Df) than reinforced laminate.

The unreinforced laminates 120a and 120b may allow connecting elements with super fine geometries to be deposited on a top side and a bottom side of the hybrid PCB 100. For example, super fine traces, micro strip transmission lines, and/or BGAs may be formed on both sides of the hybrid PCB 100. In some embodiments, the top side and the bottom side of the hybrid PCB 100 may each include traces with a trace width less than 75 micrometers. For example, a trace width 152 of a trace 150a may be equal to 50 micrometers. Traces 150b, 150c, and 150d may have the same width as the trace 150a, or different widths. Space between two traces in a micro strip pair may be equal to 60 micrometers so that a pitch width for a trace pitch may be equal to 110 micrometers in some embodiments. For example, a pitch width 154 for the pair of traces 150a and 150b may be equal to 110 micrometers. In these and other embodiments, traces in the hybrid PCB 100 may have other dimensions. For example, a trace may have a trace width less than 75 micrometers, such as between 50 micrometers and 60 micrometers, and a pitch width for a trace pitch may be between 100 micrometers and 110 micrometers.

In some embodiments, the top layer 101 may include pairs of coplanar micro strips with a differential impedance of 100 ohm (with deviation of ±10%) with reference to the internal layer 102. For example, the traces 150a and 150b may form a pair of coplanar micro strips on the top layer 101 with a differential impedance of about 100 ohm. The bottom layer 108 may also include pairs of coplanar micro strips with a differential impedance of 100 ohm (with deviation of ±10%) with reference to the internal layer 107. For example, the traces 150c and 150d may form a pair of coplanar micro strips on the bottom layer 108 with a differential impedance of about 100 ohm.

The super fine geometries of the traces, micro strip transmission lines, BGAs, and/or other elements may allow the hybrid PCB 100 to operate at a transmission speed between 25 gigabits (Gb) per second per channel and 28 gigabits per second per channel or higher. In some applications, there may be 32 parallel channels so that a transmission speed of 8 Terabits (Tb) per second may be achieved (e.g., 8 Tb/s=25 Gb/s/channel×32 channels). Each of the 32 parallel channels may include a differential micro strip transmission line that includes two parallel micro strips such as the micro strips 150a and 150b. In these and other embodiments, the hybrid PCB 100 may operate at other transmission speeds, and the transmission speeds are not limited to those described herein.

Because the unreinforced laminate 120a and 120b is softer than glass-reinforced laminate, surface finishing with palladium may be performed on the hybrid PCB 100 to improve wire bonding capability and contact durability of the hybrid PCB 100. The palladium may be sufficiently thick to allow the hybrid PCB 100 to pass corrosion tests such as a mixed flowing gas test. For example, a thickness of the palladium in the surface finish may be 0.5 micrometers (or 20 microinches), which is much thicker than a regular thickness between 0.03 micrometers and 0.3 micrometers (or between 3 microinches to 12 microinches). In some embodiments, the palladium may provide an eggshell effect on the unreinforced laminate 120 to prevent metallization from being peeled off or to prevent cratering of connector blades during construction of hot-pluggable edge connectors. In some embodiments, the surface finish may be performed using ENEPIG. In these and other embodiments, the surface finish including the palladium improves wire bonding capability and contact durability of the hybrid printed circuit board compared to an electroless nickel immersion gold (ENIG) surface finish.

The usage of palladium in the surface finish may make wire bonding feasible even though the wire bonding may not be feasible in existing surface finishes. Palladium may help the hybrid PCB 100 to pass the mixed flowing gas test and may eliminate the need for electroplated hard gold, thereby eliminating plating tie bars. Palladium may also simplify the construction process of the hybrid PCB 100 by eliminating 2nd ops drills and masking. The usage of Palladium may increase contact durability, allowing unreinforced laminate such as glass-free polyimide and ZetaLam to be used in scenarios where hot-pluggable edge connectors are constructed. In addition, palladium is less expensive than hard gold, and the usage of palladium may reduce the cost of the hybrid PCB 100 as compared to PCBs that use hard gold. In these and other embodiments, the usage of palladium may have other benefits not described herein.

In some embodiments, a thickness of the hybrid PCB 100 may be about 1 millimeter with a deviation between −10% and +10%. The hybrid PCB 100 may have a length of about 48 millimeters and a width of about 23 millimeters. In these and other embodiments, the hybrid PCB 100 may have other dimensions, and the dimension of the hybrid PCB 100 is not limited to the dimensions described herein.

The hybrid PCB 100 may include one or more connectors 128 (e.g., connector 128a and connector 128b). The connectors 128 may include hot-pluggable edge connectors. Strip lines 126 may be included in at least some of the internal layers of the hybrid PCB 100. For example, the layer 104 may include a strip line 126a with a differential impedance of 100 ohms. The layer 106 may include a strip line 126b with a differential impedance of 100 ohms. Example vias 122a, 122b, 122c, and 122d between various layers are also illustrated in FIG. 1. In some embodiments, the vias 122a-122d may be less than five mil drill (<5 mil drill).

In some embodiments, the internal layers 102 and 107 may include ground planes. At least one area in each of the ground planes 102 and 107 may be shaped and crosshatched so that the unreinforced laminate 120a, 120b (such as glass-free polyimide) and its associated adhesive material may stick to the reinforced laminate (such as FR4) rather than sticking to the ground planes 102 and 107 during a lamination process. The shaping and crosshatching of the ground planes 102 and 107 may be crafted in a way such that the impedance and high-speed path of the hybrid PCB 100 may not be affected by the shaping and crosshatching of the ground planes. In addition, the shaping and crosshatching of the ground planes may not affect the performance of the hybrid PCB 100.

In some embodiments, a total number of layers in the hybrid PCB 100 may be 4, 6, 8, 10, or another suitable number. Section 124 in FIG. 1 includes the internal layers of the hybrid PCB 100 and the laminate filled between each two adjacent internal layers. Regardless of the number of layers included in the hybrid PCB 100, unreinforced glass-free laminate may be filled between the top layer and a first internal layer immediately below the top layer and between the bottom layer and a second internal layer immediately above the bottom layer. Reinforced laminate (such as Megtron VI or FR-4) may be filled between each two adjacent internal layers.

In some embodiments, the hybrid PCB 100 may include a rigid board with ten layers including a top layer, a bottom layer, and eight internal layers stacked up between the top layer and the bottom layer. Reinforced or unreinforced laminate may be provided between adjacent pairs of the ten layers. An example implementation of the hybrid PCB 100 including a stack-up of ten layers may be illustrated in the following Table 1:

TABLE 1 a stack-up of a rigid board

| Layer | Layer Type | Thickness | Description | Material | Dk/Df |
|---|---|---|---|---|---|
| | Solder mask | 18 μm | | Solder mask | 4.5/0.029 |
| Layer 1 (L1) | Primary | 11.8 μm + plating | | | |
| Laminate between L1 and L2 | ZetaLam | 38 μm | ZetaLam ref | ZetaLam | 3.0/0.01 |
| Layer 2 (L2) | Plane | 17.1 μm + plating (30) | | | |
| Laminate between L2 and L3 | PREPREG | 99 μm | 2113 | ISOLA FR370HR | 3.96/0.02 |
| Layer 3 (L3) | Mixed | 17.1 μm (15) | | | |
| Laminate between L3 and L4 | Core | 101.6 μm (102) | | ISOLA FR370HR | 4.17/0.0191 |
| Layer 4 (L4) | Plane | 17.1 μm (15) | | | |
| Laminate between L4 and L5 | PREPREG | 122 μm | 2116 | ISOLA FR370HR | 4.03/0.197 |
| Layer 5 (L5) | Plane | 17.1 μm (15) | | | |
| Laminate between L5 and L6 | Core | 101.6 μm (102) | | ISOLA FR370HR | 4.17/0.0191 |
| Layer 6 (L6) | Plane | 17.1 μm (15) | | | |
| Laminate between L6 and L7 | PREPREG | 122 μm | 2116 | ISOLA FR370HR | 4.03/0.197 |
| Layer 7 (L7) | Plane | 17.1 μm (15) | | | |
| Laminate between L7 and L8 | Core | 101.6 μm (102) | | ISOLA FR370HR | 4.17/0.0191 |
| Layer 8 (L8) | Mixed | 17.1 μm (15) | | | |
| Laminate between L8 and L9 | PREPREG | 99 μm | 2113 | ISOLA FR370HR | 3.97/0.02 |
| Layer 9 (L9) | Plane | 17.1 μm + plating (30) | | | |
| Laminate between L9 and L10 | ZetaLam | 38 μm | ZetaLam rcf | ZetaLam | 3.0/0.01 |
| Layer 10 (L10) | Mixed | 11.8 μm + plating | | | |
| | Solder mask (copper cover %) | 18 μm Start (~finished) | | Solder mask | 4.5/0.029 |
| Overall board thickness | | 1.0 mm ± 10% | Measured finished metal to metal | | |

In the above Table 1, dielectric material between Layer 1 and Layer 2 and dielectric material between Layer 9 and Layer 10 may include ZetaLam or another suitable material. For the balance of the board, the laminate or PREPREG filled between adjacent internal layers L2-L9 may include ISOLA FR370HR with approval for IPC-4101C/26/126.

In some embodiments, the hybrid PCB 100 may include a rigid-flex board including four layers and a stiffener. The four layers may include a top layer, a bottom layer, and two internal layers stacked up between the top layer and the bottom layer. Reinforced or unreinforced laminate may be provided between adjacent pairs of the four layers. An example implementation of the hybrid PCB 100 including a stack-up of four layers may be illustrated in the following Table 2:

TABLE 2 a stack-up of a rigid-flex board

| Layer | Layer Type | Thickness | Description | Material | Dk/Df |
|---|---|---|---|---|---|
| | Coverlay area | 12 μm | KAPTON | DuPont FR7001 | 3.5/0.02 |
| | | 13 μm | Adhesive | | |
| | Solder mask area | 25 μm | Solder mask | TAIYO INK PSR-9000 | 3.7/0.038 |
| Layer 1 (L1) | Signal | 12 μm | ED Cu | | |
| | | 25 μm | KAPTON | DuPont AP7164E | 3.4/0.003 |
| | | 25 μm | Adhesive | DuPont FR0100 | 3.5/0.02 |

TABLE 2-continued a stack-up of a rigid-flex board

| Layer | Layer Type | Thickness | Description | Material | Dk/Df |
|---|---|---|---|---|---|
| Layer 2 (L2) | Mixed | 18 µm | Cu | | |
| | | 50 µm | KAPTON | DuPont AP8525R | 3.4/0.003 |
| Layer 3 (L3) | Mixed | 18 µm | Cu | | |
| | | 25 µm | Adhesive | DuPont FR0100 | 3.5/0.02 |
| | | 25 µm | KAPTON | DuPont AP7164E | 3.4/0.003 |
| Layer 4 (L4) | Mixed | 12 µm | ED Cu | | |
| | Coverlay | 13 µm | Adhesive | DuPont FR7001 | 3.5/0.02 |
| | | 12 µm | KAPTON | | |
| | | 25 µm/35 µm | Adhesive | DuPont FR0100 or SONY D3430 | 3.5/0.02 |
| Stiffener | | 1.5 mm | Stiffener | Copper (Cu) W/2.5 µm MATT Nickel (Ni) Finish | |
| | | 25 µm/35 µm | Adhesive | DuPont FR0100 or SONY D3430 | 3.5/0.02 |
| Overall board thickness | (~Cu cover %) | Start (finished) 260 µm ± 10% | Flex measured over coverlay and solder mask. | | |

Figure 2:
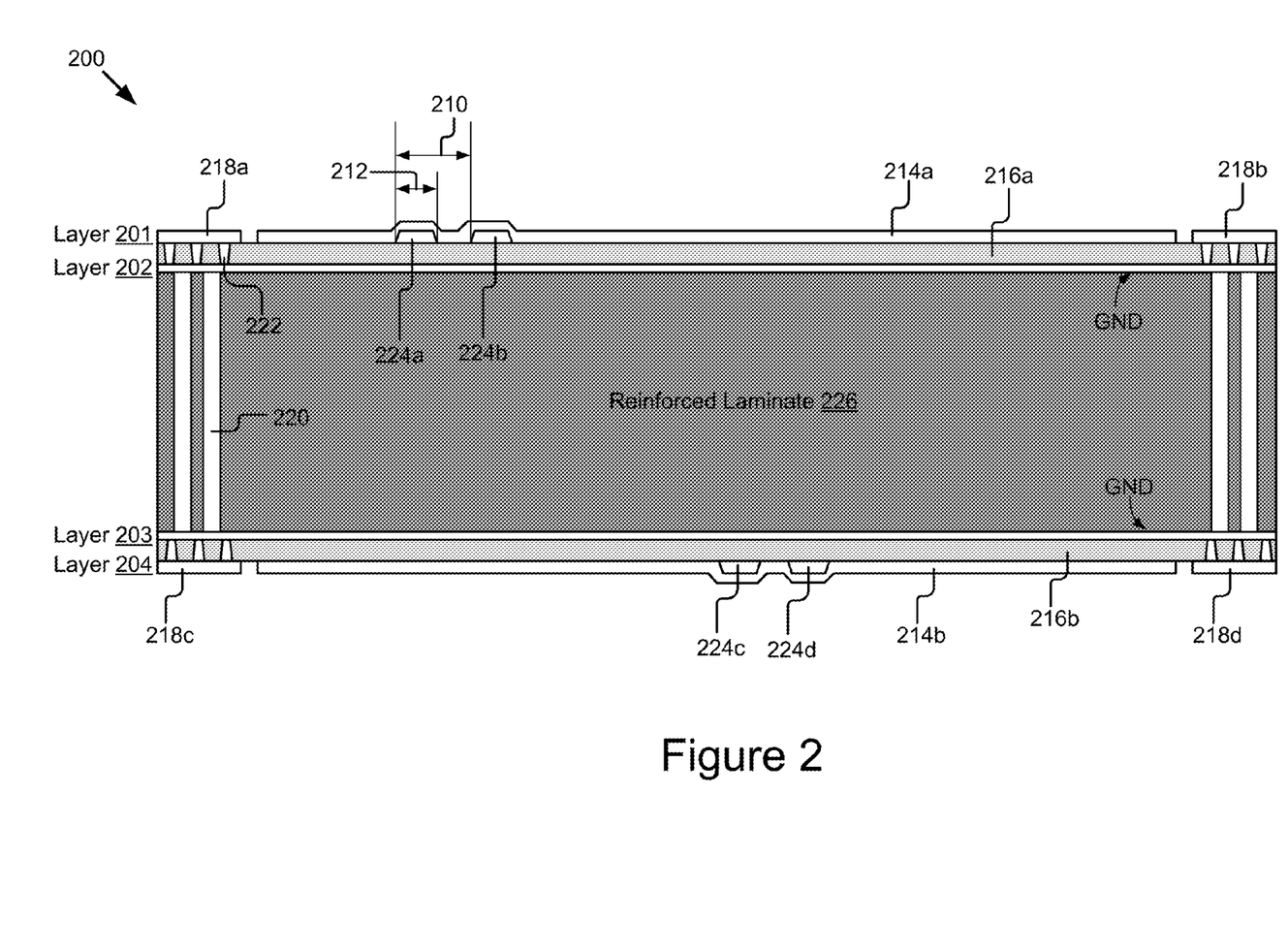
FIG. 2 is a block diagram illustrating a cross-sectional view of a stack-up of another example hybrid printed circuit board.

FIG. 2 is a block diagram illustrating a cross-sectional view of a stack-up of another example hybrid PCB 200, arranged in accordance with at least some embodiments described herein. The example hybrid PCB 200 may include a top layer 201, a bottom layer 204, and multiple internal layers such as layers 202 and 203. In these and other embodiments, a total number of layers in the hybrid PCB 200 may include 4, 6, 8, 10, or another suitable number.

A thin sheet of unreinforced laminate 216a such as glass-free dielectric material (e.g., ZetaLam, glass-free polyimide) may be placed between the top layer 201 and the internal layer 202. Another thin sheet of unreinforced laminate 216b may be placed between the bottom layer 204 and the internal layer 203. Each of the unreinforced laminates 216a and 216b may have a thickness of about 37 micrometers. Reinforced laminate 226 such as FR-4 may be placed between the internal layer 202 and the internal layer 203. Each of the internal layers 202 and 203 may act as a ground plane.

Micro strip pairs with a trace width of 50 micrometers and a pitch width of 110 micrometers may be deposited on a top side and/or a bottom side of the hybrid PCB 200. For example, a trace 224a deposited on the top side of the hybrid PCB 200 may have a trace width 212 of 50 micrometers, and a pitch width 210 for the traces 224a and 224b may be 110 micrometers. Traces 224c and 224d may have dimensions similar to the traces 224a and 224b. In these and other embodiments, traces in the hybrid PCB 200 may have other dimensions. For example, a trace may have a trace width less than 75 micrometers, such as between 50 micrometers and 60 micrometers, and a trace pitch may have a pitch width between 100 micrometers and 110 micrometers.

In some embodiments, the top layer 201 may include pairs of coplanar micro strips disposed on the top side of the hybrid PCB 200, with each pair having a differential impedance of 100 ohm (with deviation of ±10%) with reference to the internal layer 202. For example, the traces 224a and 224b may form a pair of coplanar micro strips on the top side of the hybrid PCB 200. The bottom layer 204 may also include pairs of coplanar micro strips disposed on the bottom side of the hybrid PCB 200, with each pair having a differential impedance of 100 ohm (with deviation of ±10%) with reference to the internal layer 203. For example, the traces 224c and 224d may form a pair of coplanar micro strips on the bottom side of the hybrid PCB 200.

The super fine geometries of the traces and/or micro strip transmission lines allows the hybrid PCB 200 to operate at a transmission speed between 25 gigabits per second per channel and 28 gigabits per second per channel or higher. Surface finishing including palladium may be performed on the hybrid PCB 200 to improve wire bonding capability and contact durability of the hybrid PCB 200. For example, a thickness of palladium in the surface finish may be 0.5 micrometers (or 20 microinches). In some embodiments, the surface finish may be performed using ENEPIG.

In some embodiments, a thickness of the hybrid PCB 200 may be 1 millimeter with a deviation between −10% to +10%. The hybrid PCB 200 may have a length of about 65 millimeters and a width of about 25 millimeters. In these and other embodiments, the hybrid PCB 200 may have other dimensions.

A solder mask or coverlay 214a may be placed on the top side of the hybrid PCB 200. Another solder mask or coverlay 214b may be placed on the bottom side of the hybrid PCB 200. The solder masks 214a and 214b may include liquid photo imageable (LPI) solder masks.

The hybrid PCB 200 may include zHD connectors 218a, 218b, 218c, and 218d. Microvias (µVias) between the top layer 201 and the internal layer 202 and µVias between the bottom layer 204 and the internal layer 203 are illustrated as elements 222 in FIG. 2, only one of which is labeled in FIG. 2 for simplicity. Subcomposite vias between the internal layer 202 and the internal layer 203 are illustrated as elements 220, only one of which is labeled in FIG. 2 for simplicity. Parameters associated with the µVias 222 may include 2 mil drill and 8 mil pad. Parameters associated with the subcomposite vias 220 may include 5.9 mil drill and 12 mil pad. In some embodiments, via transitions may be configured to avoid excessive losses.

In some embodiments, the internal layers 202 and 203 (e.g., ground planes) may be shaped and crosshatched so that the unreinforced laminates 216a, 216b (such as glass-free polyimide) and associated adhesive material may stick to the reinforced laminate 226 (such as FR4) rather than sticking to the ground planes 202 and 203 during a lamination process. The shaping and crosshatching of the ground planes 202 and 203 may be crafted in a way such that performance of the hybrid PCB 200 may not be affected by the shaping and crosshatching of the ground planes.

Figure 3:
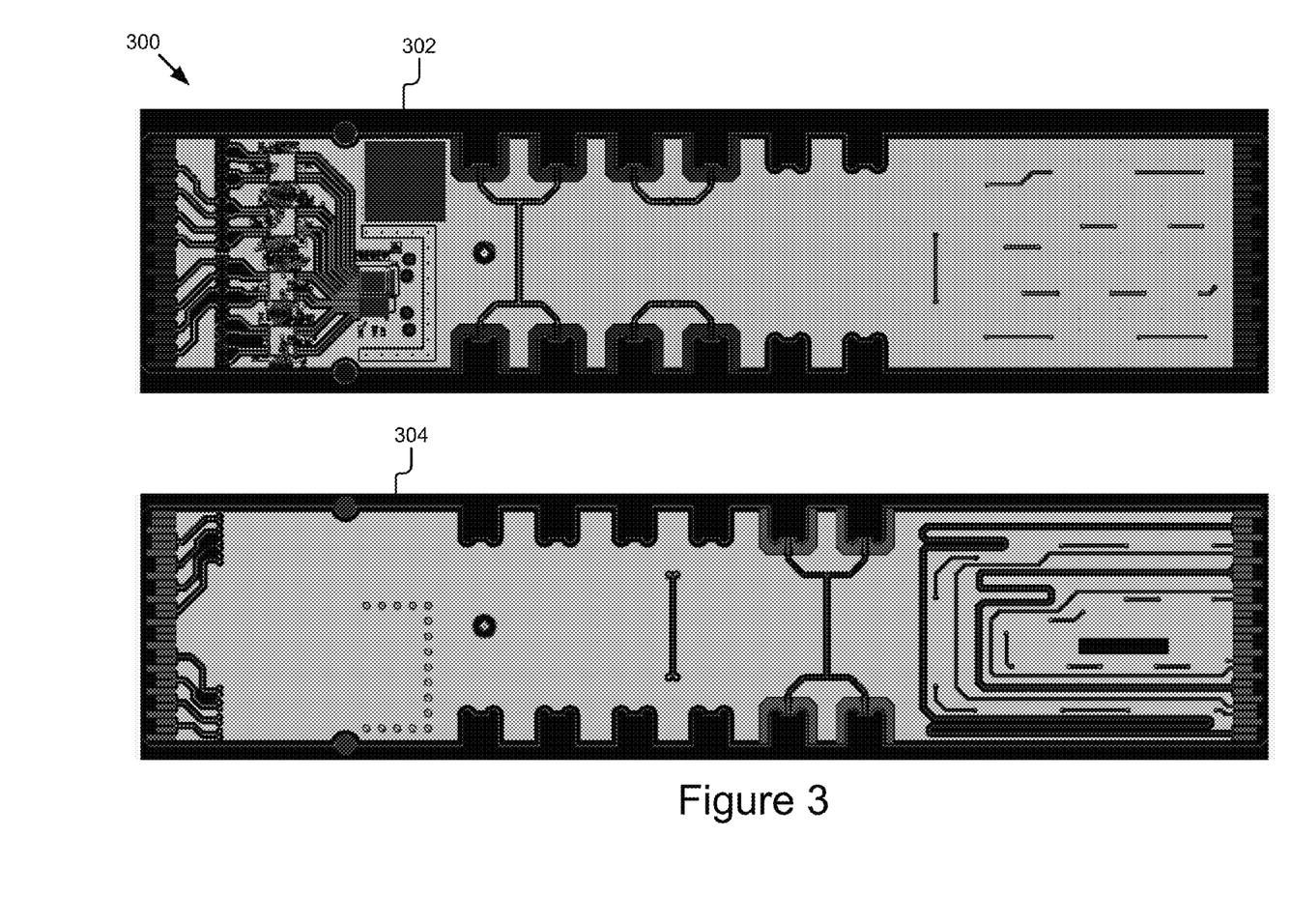
FIG. 3 includes a graphic representation illustrating a top view and a bottom view of an example hybrid printed circuit board.

FIG. 3 includes a graphic representation 300 illustrating a top view 302 and a bottom view 304 of an example hybrid PCB, arranged in accordance with at least some embodiments described herein. FIGS. 4A-4E include graphic representations 400, 420, 430, 440, and 450 illustrating different layers of the example PCB of FIG. 3, arranged in accordance with at least some embodiments described herein. The example hybrid PCB includes a total number of ten layers with a top layer, eight internal layers, and a bottom layer. The top and bottom views 302 and 304 of FIG. 3 may correspond to the hybrid PCB 100 of FIG. 1 and/or the hybrid PCB 200 of FIG. 2. Alternately or additionally, the ten layers illustrated in FIGS. 4A-4E may correspond to the ten layers of the hybrid PCB 100 of FIG. 1.

Figure 4A:
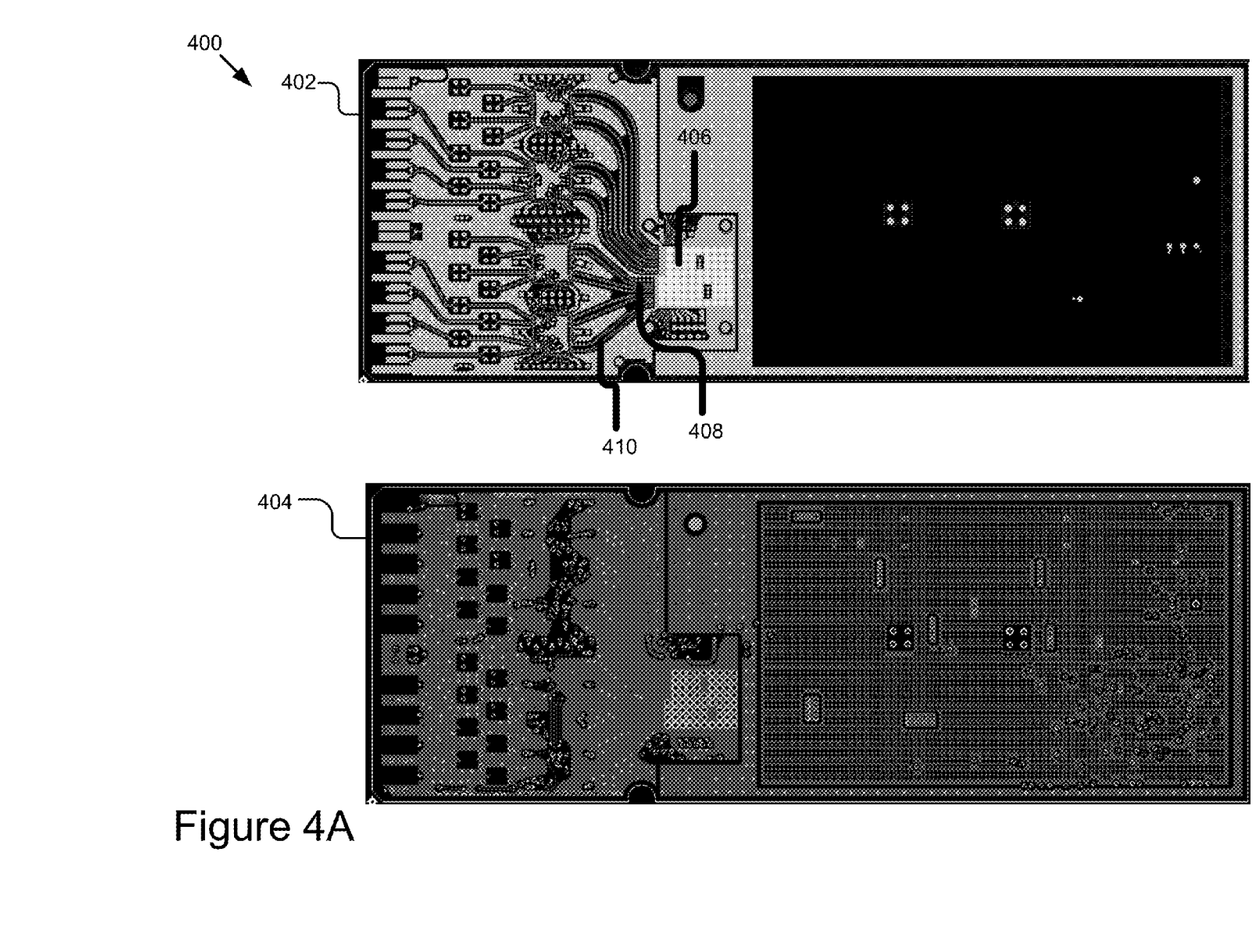
FIGS. 4A-4E include graphic representations illustrating different layers of the example hybrid printed circuit board of FIG. 3.

Referring to FIG. 4A, a top layer 402 and a first internal layer 404 of the example PCB in FIG. 3 are illustrated. The top layer 402 may include die pads 406, bond pads 408, and micro strips 410 of the hybrid PCB. Only some of the die pads 406, bond pads 408, and/or micro strips 410 are labeled in FIG. 4A for simplicity. Each pair of the micro strips 410 may have a differential impedance of about 100 ohms. Each of the micro strips 410 may have a trace width of 50 micrometers, and a trace pitch of the micro strips 410 may have a pitch width of 110 micrometers, at least in areas where the micro strips 410 are the most dense and/or for each pair of the micro strips 410.

Figure 4B:
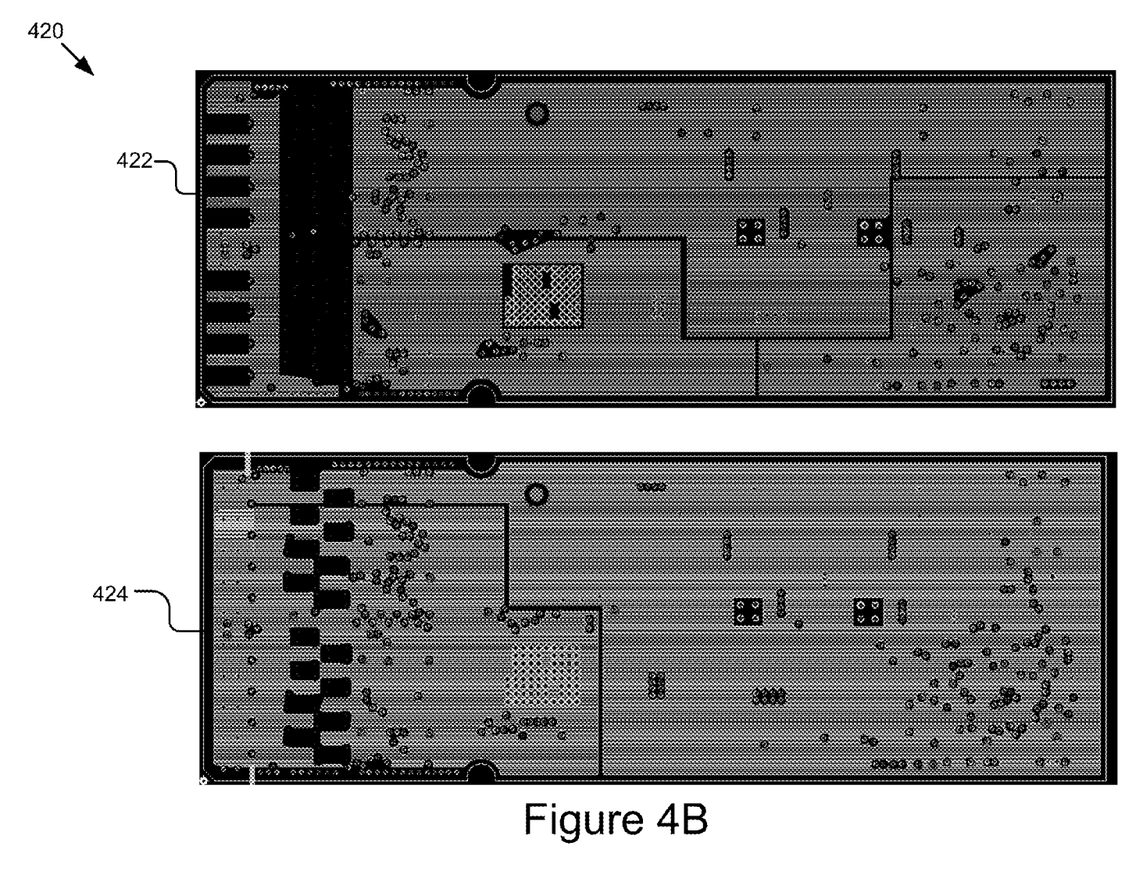
Figure 4C:
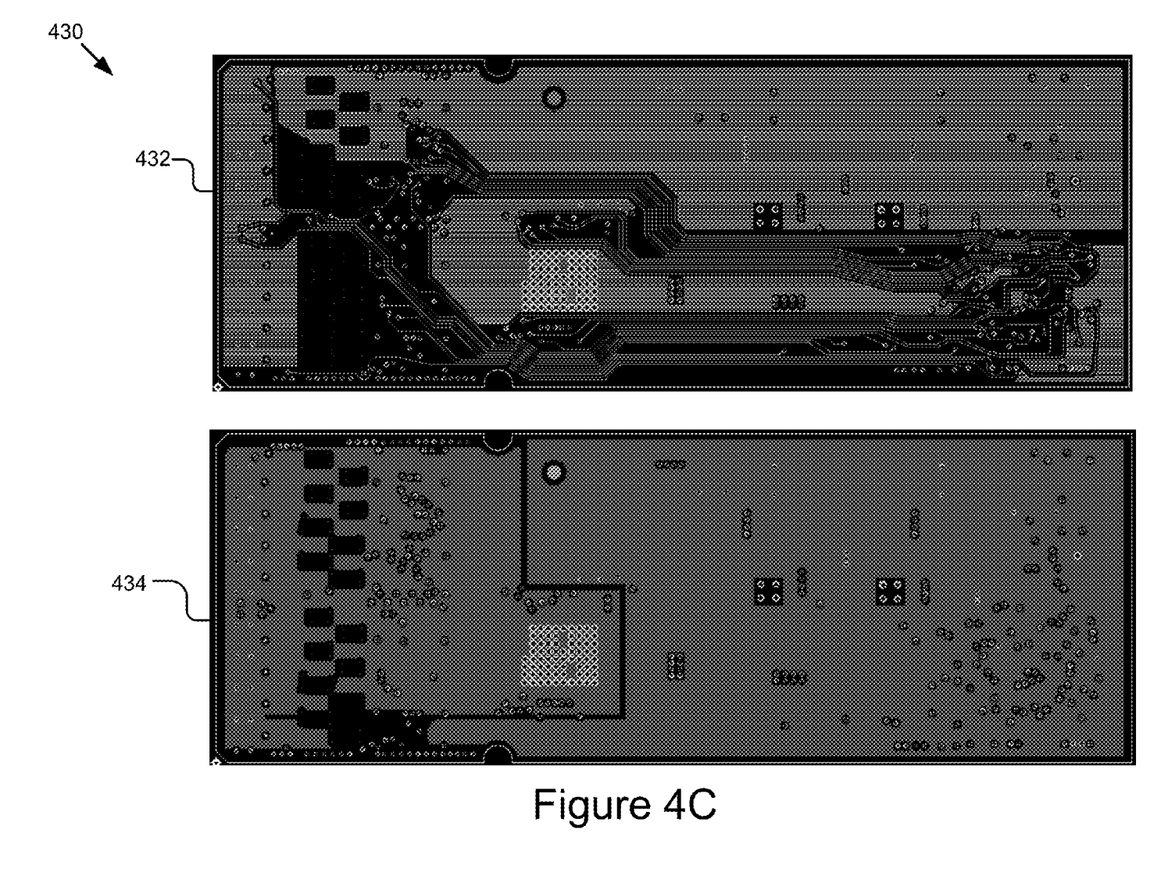
Figure 4D:
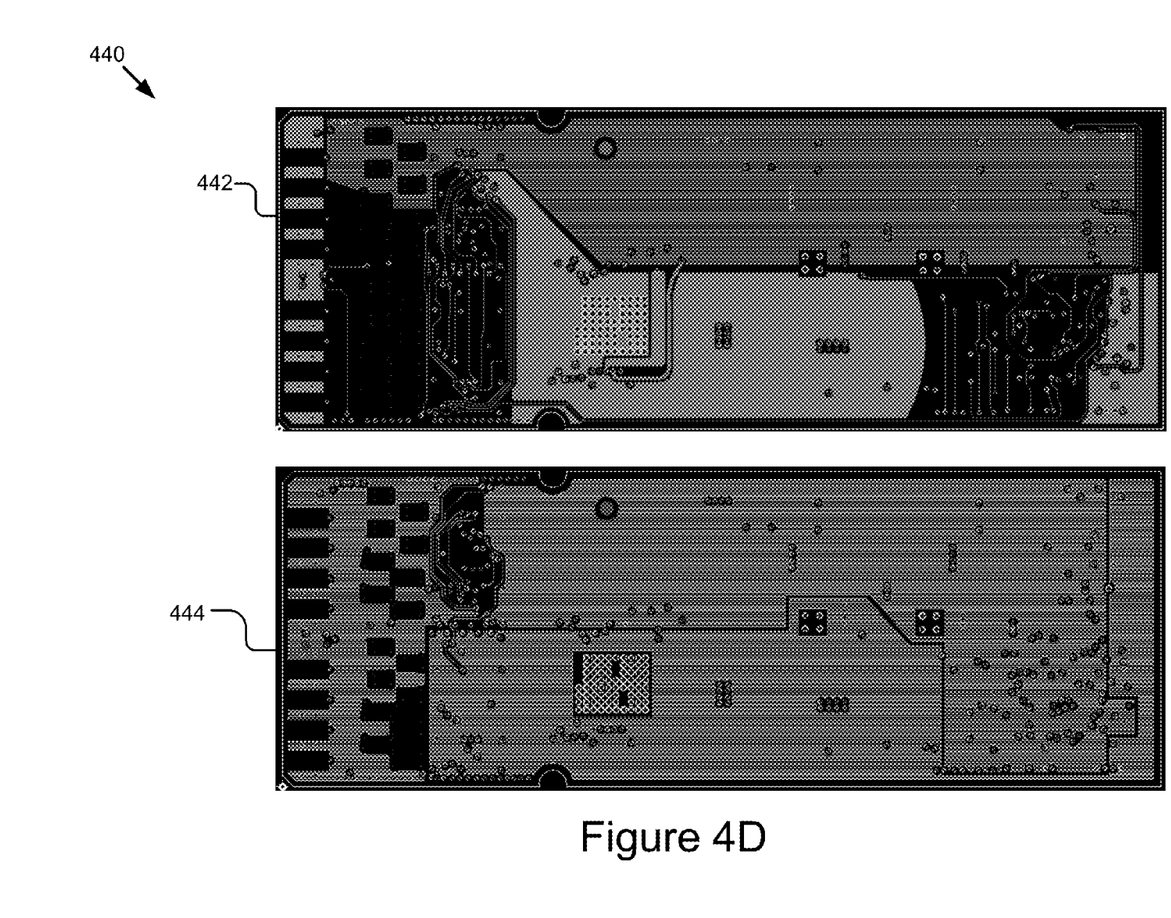

FIG. 4B illustrates a second internal layer 422 and a third internal layer 424 of the example hybrid PCB. FIG. 4C illustrates a fourth internal layer 432 and a fifth internal layer 434 of the example hybrid PCB. FIG. 4D illustrates a sixth internal layer 442 and a seventh internal layer 444 of the example hybrid PCB.

Figure 4E:
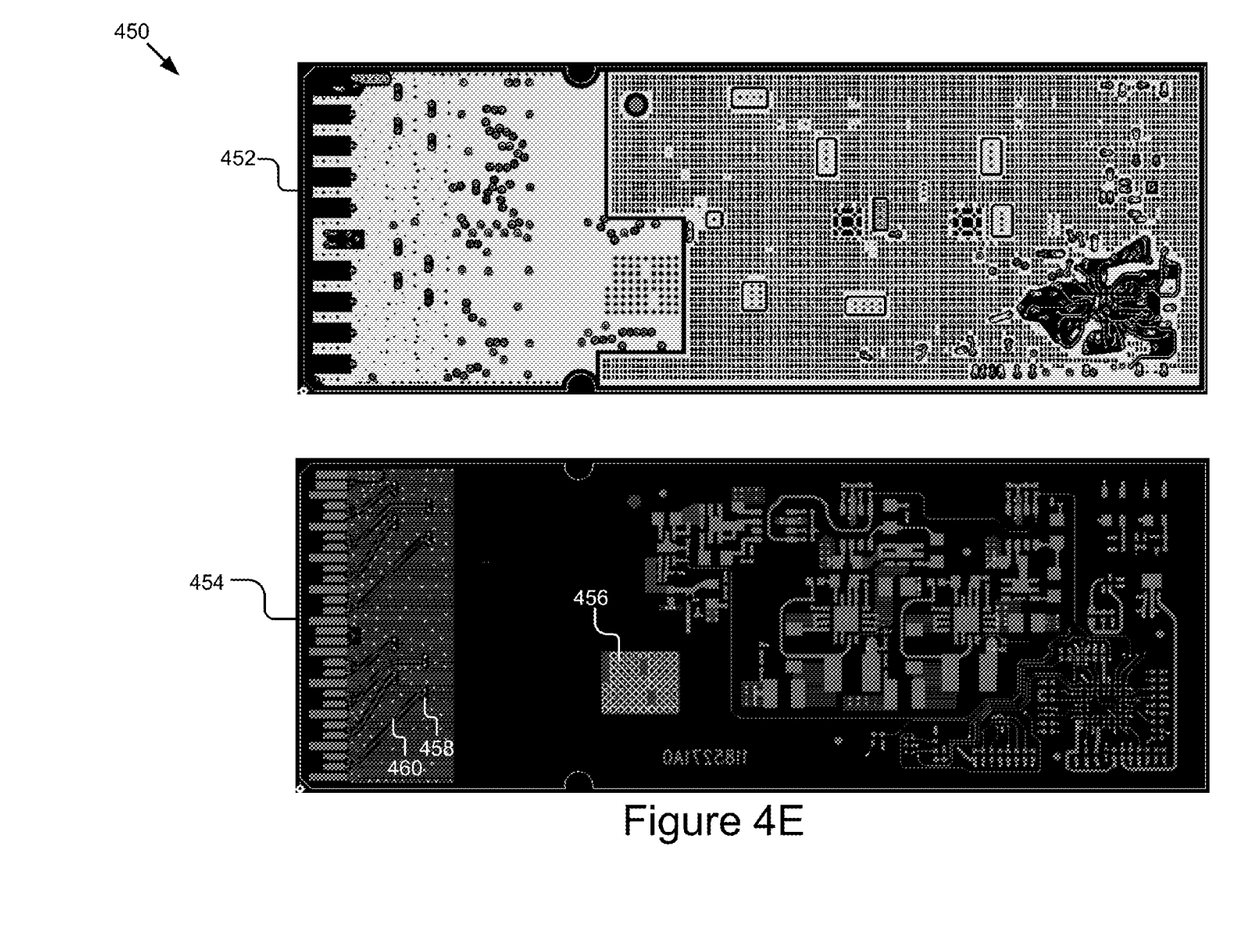

FIG. 4E illustrates an eighth internal layer 452 and a bottom layer 454 of the example hybrid PCB. The bottom layer 454 may include thermal vias 456, transition vias 458, and pairs of micro strips 460 of the hybrid PCB. Only some of the thermal vias 456, transition vias 458, and/or micro strips 460 are labeled in FIG. 4E for simplicity. Each pair of the micro strips 460 may have a differential impedance of about 100 ohms. Each of the micro strips 460 may have a trace width of 50 micrometers, and a trace pitch of the micro strips 460 may have a pitch width of 110 micrometers, at least in areas where the micro strips 460 are the most dense and/or for each pair of the micro strips 460.

The present disclosure is not to be limited in terms of the particular embodiments described herein, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds, compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A hybrid printed circuit board comprising:
   a top layer;
   a bottom layer;
   a plurality of internal layers stacked up between the top layer and the bottom layer, the plurality of internal layers including a first internal layer below the top layer and a second internal layer above the bottom layer;
   first unreinforced laminate placed between the top layer and the first internal layer;
   second unreinforced laminate placed between the second internal layer and the bottom layer;
   third laminate placed between adjacent internal layers of the plurality of internal layers; and
   traces on at least one of a top side or a bottom side of the hybrid printed circuit board, wherein the traces each have a width less than 75 micrometers.

2. The hybrid printed circuit board of claim 1, wherein the first unreinforced laminate and the second unreinforced laminate include glass-free dielectric material.

3. The hybrid printed circuit board of claim 1, wherein the first unreinforced laminate and the second unreinforced laminate include one of glass-free polyimide, liquid crystal polymer, and ZetaLam.

4. The hybrid printed circuit board of claim 1, wherein the third laminate includes reinforced laminate.

5. The hybrid printed circuit board of claim 4, wherein the reinforced laminate includes glass-reinforced epoxy laminate.

6. The hybrid printed circuit board of claim 5, wherein the glass-reinforced epoxy laminate includes flame retardant 4 (FR-4).

7. The hybrid printed circuit board of claim 4, wherein the reinforced laminate includes Megtron VI.

8. The hybrid printed circuit board of claim 4, wherein the reinforced laminate includes pre-impregnated (PREPREG) composite fibers.

9. The hybrid printed circuit board of claim 1, wherein a surface finish of the hybrid printed circuit board includes palladium.

10. A hybrid printed circuit board comprising:
    a top layer;
    a bottom layer;

a plurality of internal layers stacked up between the top layer and the bottom layer, the plurality of internal layers including a first internal layer below the top layer and a second internal layer above the bottom layer;
first unreinforced laminate placed between the top layer and the first internal layer;
second unreinforced laminate placed between the second internal layer and the bottom layer; and
third laminate placed between adjacent internal layers of the plurality of internal layers;
wherein a surface finish of the hybrid printed circuit board includes palladium and a thickness of the palladium is about 0.5 micrometer.

11. The hybrid printed circuit board of claim 9, wherein the surface finish comprises electroless nickel electroless palladium immersion gold (ENEPIG) surface finish.

12. A hybrid printed circuit board comprising:
a top copper-foil layer;
a bottom copper-foil layer;
a plurality of internal copper-foil layers stacked up between the top copper-foil layer and the bottom copper-foil layer, the plurality of internal copper-foil layers including a first internal copper-foil layer below the top copper-foil layer and a second internal copper-foil layer above the bottom copper-foil layer;
first unreinforced laminate between the top copper-foil layer and the first internal copper-foil layer;
second unreinforced laminate between the second internal copper-foil layer and the bottom copper-foil layer; and
third laminate placed between adjacent internal copper-foil layers of the plurality of internal copper-foil layers.

13. The hybrid printed circuit board of claim 1, wherein the width of each of the traces is 50 micrometers and a trace pitch of the traces is 110 micrometers.

14. The hybrid printed circuit board of claim 1, wherein the width of each of the traces is between 50 micrometers and 60 micrometers and a trace pitch of the traces is between 100 micrometers and 110 micrometers.

15. The hybrid printed circuit board of claim 1, wherein the hybrid printed circuit board is configured to operate at a transmission speed of at least about 25 gigabits per second per channel.

16. A hybrid printed circuit board comprising:
a top layer;
a bottom layer;
a plurality of internal layers stacked up between the top layer and the bottom layer, the plurality of internal layers including a first internal layer below the top layer and a second internal layer above the bottom layer;
first unreinforced laminate placed between the top layer and the first internal layer;
second unreinforced laminate placed between the second internal layer and the bottom layer; and
third laminate placed between adjacent internal layers of the plurality of internal layers;
wherein the hybrid printed circuit board has a thickness of 1 millimeter with a deviation between −10% to +10%.

17. The hybrid printed circuit board of claim 1, wherein the hybrid printed circuit board has a total number of four copper-foil layers including the top layer, the first internal layer, the second internal layer, and the bottom layer.

18. The hybrid printed circuit board of claim 1, wherein:
the hybrid printed circuit board has a total number of eight layers including the top layer, the bottom layer, and six internal layers stacked up between the top layer and the bottom layer; and
the six internal layers include the first internal layer, the second internal layer, and four additional internal layers stacked up between the first internal layer and the second internal layer.

19. The hybrid printed circuit board of claim 1, wherein:
the hybrid printed circuit board has a total number of ten layers including the top layer, the bottom layer, and eight internal layers stacked up between the top layer and the bottom layer; and
the eight internal layers includes the first internal layer, the second internal layer, and six additional internal layers stacked up between the first internal layer and the second internal layer.

20. The hybrid printed circuit board of claim 1, wherein a thickness of each of the first unreinforced laminate and the second unreinforced laminate is about 37 micrometers.

* * * * *